United States Patent
Burton et al.

(10) Patent No.: US 8,681,495 B2
(45) Date of Patent: Mar. 25, 2014

(54) MEDIA DEVICE HAVING A PIEZOELECTRIC FAN

(75) Inventors: David Robert Burton, Skipton (GB);
Matthew Stephens, Harrogate (GB);
Greg Blythe, Wilberfoss (GB); Trevor Hardaker, Bradford (GB)

(73) Assignee: Eldon Technology Limited, Keighley (GB)

( * ) Notice: Subject to any disclaimer, the term of this patent is extended or adjusted under 35 U.S.C. 154(b) by 260 days.

(21) Appl. No.: 13/074,964

(22) Filed: Mar. 29, 2011

(65) Prior Publication Data

US 2012/0250256 A1 Oct. 4, 2012

(51) Int. Cl.
*H05K 7/20* (2006.01)

(52) U.S. Cl.
USPC ...... 361/695; 361/679.49; 361/690; 361/719; 62/3.1; 62/259.2; 174/547

(58) Field of Classification Search
USPC .............. 361/679.46–679.54, 688–696, 361/701–711, 714–722, 752, 760–761
See application file for complete search history.

(56) References Cited

U.S. PATENT DOCUMENTS

| | | |
|---|---|---|
| 5,008,582 A | 4/1991 | Tanuma et al. |
| 5,296,739 A | 3/1994 | Heilbronner et al. |
| 5,500,556 A | 3/1996 | Kosugi |
| 5,673,176 A | 9/1997 | Penniman et al. |
| 5,911,582 A | 6/1999 | Redford et al. |
| 5,921,757 A | 7/1999 | Tsutsui et al. |
| 5,965,937 A | 10/1999 | Chiu et al. |
| 6,025,991 A | 2/2000 | Saito |
| 6,049,469 A | 4/2000 | Hood et al. |
| 6,128,194 A | 10/2000 | Francis |
| 6,212,074 B1 | 4/2001 | Gonsalves et al. |
| 6,219,236 B1 | 4/2001 | Hirano et al. |
| 6,577,504 B1 | 6/2003 | Lofland et al. |
| 6,588,497 B1 * | 7/2003 | Glezer et al. ............ 165/84 |
| 6,665,187 B1 | 12/2003 | Alcoe et al. |

(Continued)

FOREIGN PATENT DOCUMENTS

| | | |
|---|---|---|
| EP | 0601516 A1 | 6/1994 |
| EP | 0634890 A1 | 1/1995 |

(Continued)

OTHER PUBLICATIONS

Stephens et al., Matthew, "Passive, Low-Profile Heat Transferring System," U.S. Appl. No. 13/051,930, filed Mar. 18, 2011.

(Continued)

*Primary Examiner* — Courtney Smith
(74) *Attorney, Agent, or Firm* — Lowe Graham Jones PLLC

(57) ABSTRACT

A media device includes at least one piezoelectric fan selectively located to draw or urge air past one or more electrical components, such as an integrated circuit chip. Preferably, the piezoelectric fan is located within a channel milled or otherwise formed in the chip, however the fan may be located proximate the channel yet in fluid communication therewith. The piezoelectric fan operates to convectively cool the electrical component and may also prevent heat that has been generated by the electrical component from moving toward another electrical component within the media device. Thus, the configuration and location of the piezoelectric fan may advantageously cool one component while preventing heat energy from building up around one or more other components mounted nearby.

20 Claims, 3 Drawing Sheets

(56) References Cited

U.S. PATENT DOCUMENTS

| | | | |
|---|---|---|---|
| 6,818,276 B2 | 11/2004 | Bourdelais et al. | |
| 6,946,856 B1 | 9/2005 | Tellkamp | |
| 6,982,877 B2 | 1/2006 | Vinson et al. | |
| 7,236,368 B2 | 6/2007 | Maxwell et al. | |
| 7,248,475 B2 * | 7/2007 | Paydar et al. | 361/695 |
| 7,310,233 B2 | 12/2007 | Bell | |
| 7,312,534 B2 | 12/2007 | delos Santos et al. | |
| 7,345,885 B2 | 3/2008 | Bourdreaux et al. | |
| 7,550,825 B2 | 6/2009 | Santos et al. | |
| 7,629,400 B2 | 12/2009 | Hyman | |
| 7,742,299 B2 * | 6/2010 | Sauciuc et al. | 361/695 |
| 7,983,045 B2 * | 7/2011 | Bhattacharya et al. | 361/707 |
| 8,179,679 B2 * | 5/2012 | Slagle | 361/720 |
| 8,373,986 B2 * | 2/2013 | Sun | 361/695 |
| 2004/0032710 A1 | 2/2004 | Fujiwara et al. | |
| 2005/0008832 A1 | 1/2005 | Santos et al. | |
| 2005/0013116 A1 * | 1/2005 | Pokharna et al. | 361/695 |
| 2005/0036292 A1 | 2/2005 | Chengalva et al. | |
| 2005/0111195 A1 | 5/2005 | Wu et al. | |
| 2005/0266295 A1 | 12/2005 | Takai | |
| 2006/0198108 A1 | 9/2006 | Refai-Ahmed et al. | |
| 2007/0119573 A1 * | 5/2007 | Mahalingam et al. | 165/80.4 |
| 2007/0215907 A1 | 9/2007 | Krimmer et al. | |
| 2007/0278683 A1 | 12/2007 | Santos et al. | |
| 2008/0135216 A1 | 6/2008 | Zhang et al. | |
| 2008/0137291 A1 * | 6/2008 | Mongia et al. | 361/690 |
| 2008/0277780 A1 | 11/2008 | Hayakawa | |
| 2009/0091904 A1 * | 4/2009 | Hatanaka et al. | 361/764 |
| 2010/0111666 A1 | 5/2010 | Guitton et al. | |
| 2010/0261386 A1 | 10/2010 | Blum et al. | |
| 2010/0290183 A1 | 11/2010 | Rijken et al. | |
| 2011/0063801 A1 | 3/2011 | Lin et al. | |
| 2012/0050988 A1 | 3/2012 | Rothkopf et al. | |
| 2012/0243166 A1 * | 9/2012 | Burton et al. | 361/679.31 |

FOREIGN PATENT DOCUMENTS

| | | |
|---|---|---|
| EP | 1760781 A1 | 8/2006 |
| EP | 1748688 A2 | 1/2007 |
| EP | 1991042 A2 | 5/2009 |
| EP | 2138922 A1 | 12/2009 |
| JP | 2003249780 A | 9/2003 |
| WO | 03/107427 | 12/2003 |
| WO | 2006101346 A1 | 9/2006 |
| WO | 2009/058149 | 5/2009 |
| WO | 2009096966 A1 | 8/2009 |
| WO | 2011146302 A1 | 11/2011 |

OTHER PUBLICATIONS

Burton et al., David Robert, "Media Content Device Chassis with Internal Extension Members," U.S. Appl. No. 13/052,685, filed Mar. 21, 2011.

Burton et al., David Robert, "Media Content Device with Customized Panel," U.S. Appl. No. 13/074,971, filed Mar. 29, 2011.

Hardaker et al., Trevor, "Apparatus, Systems and Methods for Detecting Infrared Signals at a Media Device Configured to be Positioned in Different Orientations," U.S. Appl. No. 13/036,943, filed Feb. 28, 2011.

Burton et al., David Robert, "Apparatus, Systems and Methods for Power Line Carrier Data Communication to DC Powered Electronic Device," U.S. Appl. No. 13/074,736, filed Mar. 29, 2011.

Burton et al., David Robert, "Apparatus, Systems and Methods for Securely Storing Media Content Events on a Flash Memory Device," U.S. Appl. No. 13/053,492, filed Mar. 22, 2011.

Burton et al., David Robert, "Apparatus, Systems and Methods for Control of Inappropriate Media Content Events," U.S. Appl. No. 13/053,487, filed Mar. 22, 2011.

PiezoFans, LLC—Piezo Fans and Piezoelectric Technology, "Advanced Micro-Cooling Systems" Product Description, http://piezofans.com/, download date Mar. 4, 2011, 2 pages.

* cited by examiner

MEDIA DEVICE HAVING A PIEZOELECTRIC FAN

BACKGROUND

A media device, which may take the form of a set top box (STB), is configured to deliver selected media content and typically connects to a flat screen television and an external signal source in which the signal (e.g., cable signal) is converted into viewable media content. However, the media device may operate with other systems such as, but not limited to, other televisions (TVs), personal computers (PCs), stereos, personal digital assistants (PDAs), surround-sound systems, and digital video recorders (DVRs). Particular media content may be selected by a user who provides instructions to the media device. The selected media content may then be presented to the user. For example, if the selected media content is a movie, the video portion of the movie is displayed on a screen of the TV, a monitor of the PC, or some other display medium. The audio portion of the movie may concurrently be presented over the speakers of the TV, the stereo, or the surround-sound system. In some instances, the selected media content may be stored into a DVR or other recording device for later retrieval and presentation. The DVR may be an integrated component of the media device, or the DVR may be a stand-alone device that is communicatively coupled to the media device.

For a variety of reasons such as consumer demand, portability, spatial constraints and aesthetics, the tendency in the marketplace has been toward more streamlined components still capable of providing a high quality media content (e.g., flat screen televisions and small, wall mounted speakers). However, one of the continual challenges of making a low profile, streamlined media device remains the heat transfer issues to or from various electrical components within the media device, where such electrical components are typically mounted on a printed circuit board (PCB). Conventional media devices generally promote heat transfer with an active cooling system that employs one or more convention fans or blowers having rotating blades to move air through the media device. Some drawbacks of a conventional fan are the amount of spatial envelope needed within the media device to mount and adequately operate the fan, noise generated by the operating fan, the additional heat generated by the operating fan, and a limited operational life due to mechanical or environmental wear or stress.

SUMMARY

A media device, which may take the form of a set top box, includes a piezoelectric fan selectively located to push or pull air past an electrical component, such as an integrated circuit chip (IC chip) having a hot die, a microprocessor chip, a memory chip, etc. In one embodiment, the piezoelectric fan is selectively located within a channel milled or otherwise formed in the chip. In another embodiment, the piezoelectric fan is located with a channel formed within a panel of a chassis for the media device. The chassis for the media device generally includes a top panel, side or rim panels, and a bottom panel. The piezoelectric fan operates to convectively cool the electrical component and may be arranged to prevent heat generated by the electrical component from moving toward an adjacent electrical component also mounted to the circuit board.

In accordance with one aspect, a system includes a chassis having at least one panel with opposing surfaces, and one of the opposing surfaces is exposed to an ambient environment. A circuit board is located within the chassis with at least one electrical component mounted on the circuit board. The electrical component includes a channel or duct formed therein. A piezoelectric fan is located within the chassis to generate a thermally convective flow of air proximate the electrical component, which may include generating an air flow along the channel formed in the electrical component.

In accordance with another aspect, a system includes a chassis having a top panel with an interior surface and an exterior surface. The exterior surface is exposed to an ambient environment. A heat shield extends from the interior surface and includes an upper end portion coupled to the top panel and a free end portion distal from the upper end portion. A circuit board is located within the chassis and has at least two electrical components mounted proximate each other on the circuit board. The electrical components are spaced apart such that the free end portion of the heat shield extends into the spaced apart region. One of the electrical components includes a channel formed therein. A piezoelectric fan located within the chassis generates air flow along the channel and beneath the free end portion of the heat shield.

In accordance with yet another aspect, a method for cooling within a media device includes (1) activating a piezoelectric fan to generate an air flow within the media device; (2) directing the air flow through a channel formed in an electrical component mounted on a circuit board within the media device; and (3) convectively transferring heat from the electrical component to another region within the media device.

BRIEF DESCRIPTION OF THE DRAWINGS

In the drawings, identical reference numbers identify similar elements or acts. The sizes and relative positions of elements in the drawings may not be necessarily drawn to scale. For example, the shapes of various elements, thicknesses and angles may not be drawn to scale, and some of these elements may be arbitrarily enlarged or positioned to improve drawing legibility. Preferred and alternative embodiments are described in detail below with reference to the following drawings.

DETAILED DESCRIPTION

Figure 1:
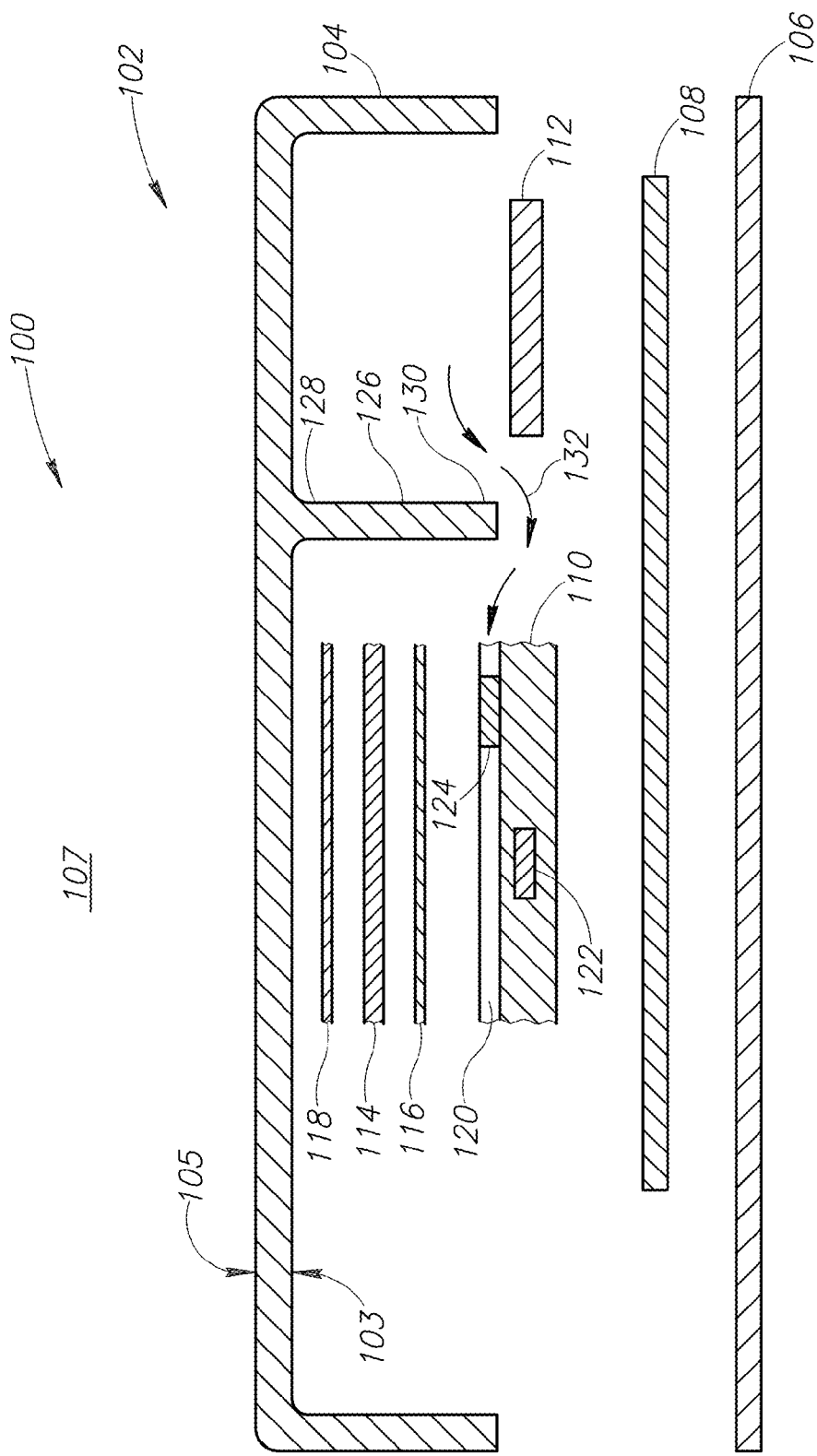
FIG. 1 is an exploded, cross-sectional, schematic view of a media device having a piezoelectric fan arranged in a channel of an electrical component in accordance with one embodiment.

FIG. 1 is a schematic, cross-sectional view of a media device 100, otherwise referred to as a set top box (STB), having a low-profile, two-piece chassis 102. The chassis 102 includes a top panel 104 and a bottom panel 106. The top panel includes an interior surface 103 and an exterior surface 105, in which the latter is exposed to an ambient environment 107. Arranged within the chassis 102 is a circuit board 108, such as a printed circuit board (PCB), and at least two electrical components 110, 112 mounted to the circuit board 108.

The term "low-profile" as used herein broadly refers to an external spatial envelope taken up by the assembled media device 100. A low-profile chassis may take the form of an enclosure whose dimensions are dictated by the physical size of the internal components necessary for providing product feature and function with little or no additional capacity/expansion in the enclosure's envelope for supporting active or passive cooling components. By way of example, the low-profile chassis 102 may have a height of about 8.0 mm to about 25.4 mm. In use, the low-profile chassis 102 may be spatially oriented in a variety of ways, such a vertically behind a wall mounted television or horizontally on a shelf or media cabinet. Thus, the directional references used herein are for interpretation of the drawings and are not meant to limit the scope of the invention. For example, convective or conductive heat transfer may occur in a variety of directions regardless of the two-dimensional examples shown in the drawings.

The media device 100 may include a heat transferring unit 114, which provides a thermally conductive path from the component being cooled 110 to the chassis 102. The conductive path may include one or more additional layers, such as, but not limited to a thermal interface layer 116 and a gap filling layer 118, where one or both layers may provide a means to account for physical, dimensional tolerance adjustments within the media device 100 and/or provide bonding means between the respective components.

The electrical components 110, 112 may have similar or different configurations and/or functions, for example the electrical component 110 includes a hot die 122 while the other electrical component 112 does not. In the illustrated embodiment, the electrical component 110, includes a channel 120 formed therein to support a piezoelectric fan 124, which may push or pull air around other components mounted on the circuit board 108, prevent hot air caused by radiated heat to build up around the hot die 122, or some combination thereof. By way of example, the electrical components may take the form of integrated circuit chips (IC chips) with or without the hot die 122, microprocessor chips, or memory chips, and the components 110, 112 may perform different functions and/or have different configurations.

The chassis 102 optionally includes a heat shield 126, which may also take the form of a heat bridge or some combination of a shield and a bridge. The heat shield 126 may be integrally formed with the chassis 102. The heat shield 126 includes an upper end portion 128 coupled to the top panel 104 and a free end portion 130 distally located from the upper end portion 128. Preferably, the free end portion 130 does not contact the circuit board 108 after the media device 100 has been fully assembled. Stated otherwise, the free end portion 130 is spaced apart from the circuit board 108.

The piezoelectric fan 124 is arranged proximate to or supported in the channel 120 to push or pull air toward the hot die 122 and to contemporaneously move air past the heat shield 126 as indicated by directional air flow arrows 132. In one embodiment, the piezoelectric fan 124 includes a flexible blade attached to a ceramic element, and the blade is set in motion by applying a minimal (e.g., low power) alternating current (AC) or a minimal, pulsing direct current (DC) to the ceramic element. The blade is typically made of Mylar, and the ceramic element is typically a piezoceramic bending element. The minimal current of electricity causes the piezoceramic to elongate and contract, which in turn bends the blade back and forth to impart a flapping action of the blade or blades that directs a desired rate of air flow in a desired direction. The length and thickness ratios of the piezoceramics and the blades may be customized to provide an appropriate amount of air flow to convectively transfer heat from a variety of electrical components as arranged within different types and different sized media devices.

The piezoelectric fan 124 may have a variety of advantages over conventional fans or blowers. For example, the piezoelectric fan 124 allows the chassis 102 of the media device 100 to be low profile (e.g., thinner) as compared to a media device having a conventional fan with rotating blades. The piezoelectric fan 124 may require less power than a convention fan while producing negligible heat. Moreover, the piezoelectric fan 124 does not have any bearings or wearing parts and is much quieter, if not essentially noiseless, as compared to conventional fans.

Figure 2:
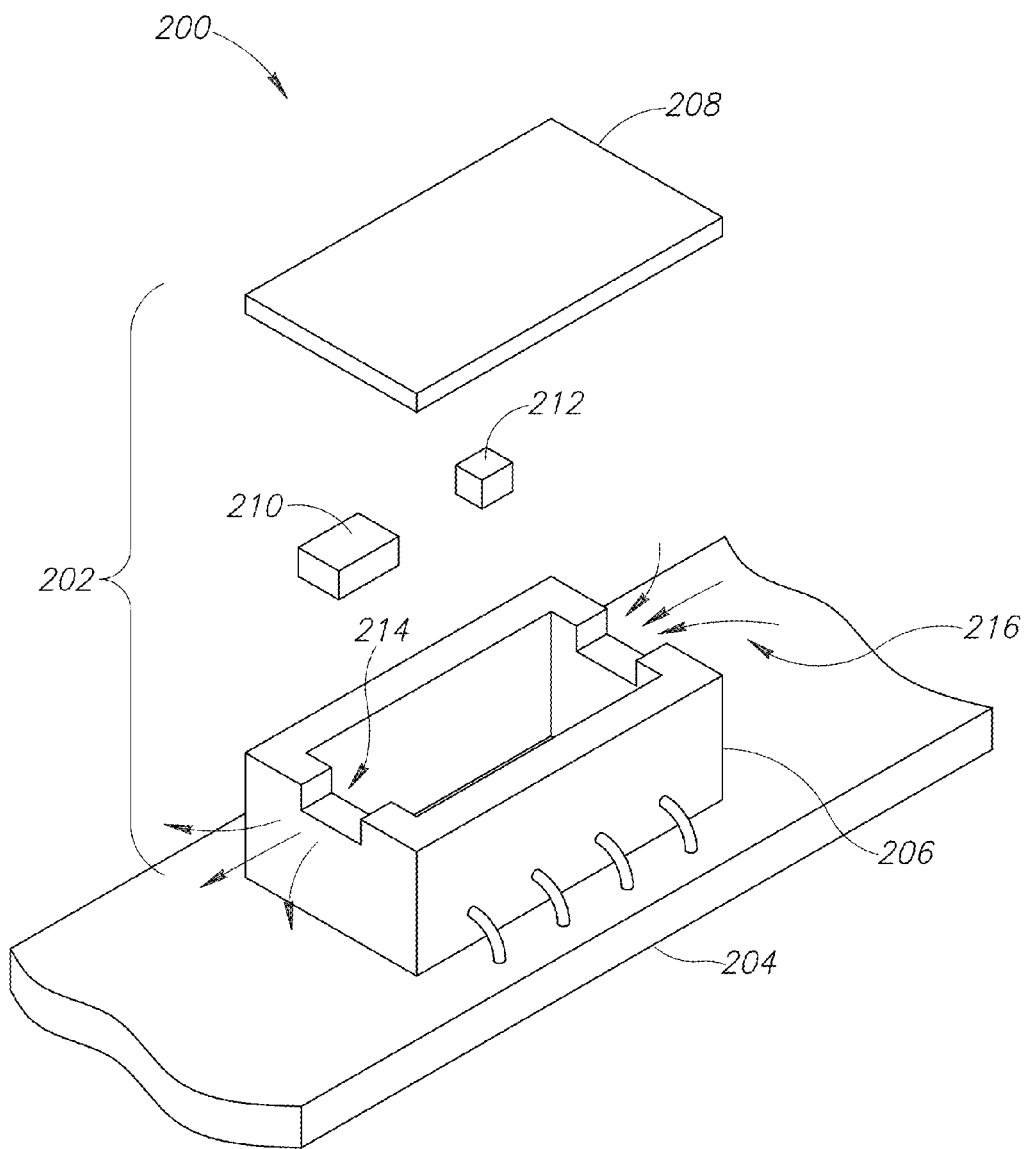
FIG. 2 is a perspective view an electrical component having a channel and a piezoelectric fan positioned within the electrical component in accordance with another embodiment.

FIG. 2 shows an assembly 200 within a media device (not shown). The assembly 200 includes an electrical device 202 mounted on a circuit board 204. The electrical device 202 includes a body 206, a lid 208, a hot die 210 located within the body 206, and a piezoelectric fan 212 also located within the body 206. The electric device 202 may take the form of a pre-fabricated integrated circuit chip in which the hot die 210 and the fan 212 are installed using known semiconductor assembly techniques. The fan 212 is positioned within the body 206 to move (e.g., push or pull) air 216 through a channel 214 formed in the body 206. The channel 214 is shown as an open channel or trench that may be etched, machined or otherwise formed in the body 206. Alternatively, the channel 214 may be a closed channel or duct, may have various shapes (e.g., square, round, oval, rectangular, etc.), and may be aligned as illustrated or have a curve or bend. The piezoelectric fan 212 may situated toward one end of the body 206 to move air either toward or away from the hot die 210.

Figure 3:
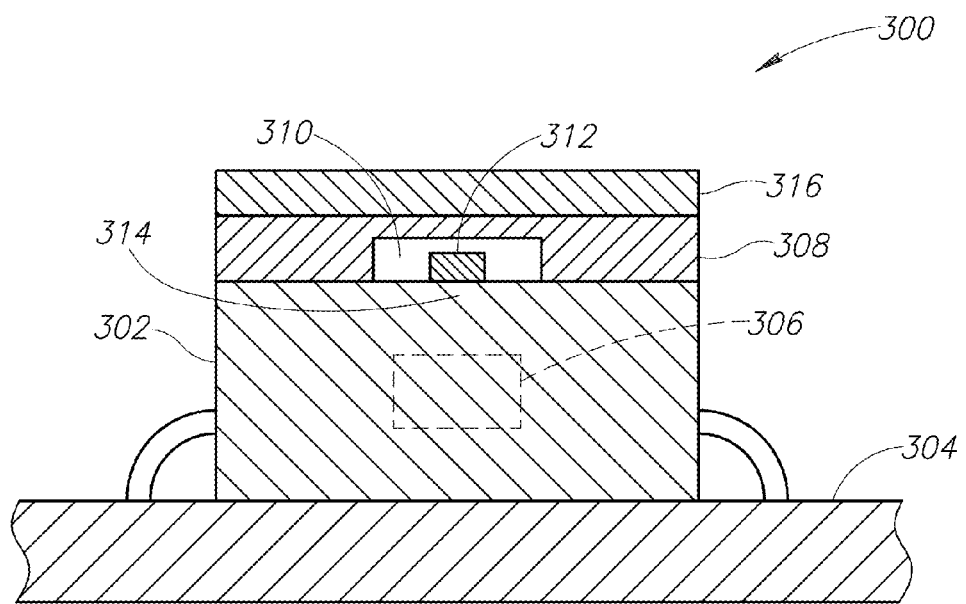
FIG. 3 is a cross-sectional view of an electrical component having a lid with a channel and further having a piezoelectric fan positioned to generate an air flow through the channel in accordance with another embodiment.

FIG. 3 shows a cross-sectional view of another assembly 300 having a chip 302 mounted on a circuit board 304. A hot die 306 is located within the chip 302, which in turn is covered with a lid 308 having a channel 310. In the illustrated embodiment, the lid 308 has a C-shape with an open side of the "C" facing downward toward the hot die 306. A piezoelectric fan 312 may be located on a bridge portion 314 of the chip 302 or positioned outside of the chip 302, yet aligned with the channel 310. Alternatively, the fan 312 may be mounted or bonded to the lid 308. The channel 310 is preferably wide enough to permit a sufficient amount of air flow at a sufficient rate to convectively transfer heat generated by the hot die 306 within the chip 302. The assembly 300 may further include a heat spreader 316 in thermally conductive contact with the lid 308.

Figure 4:
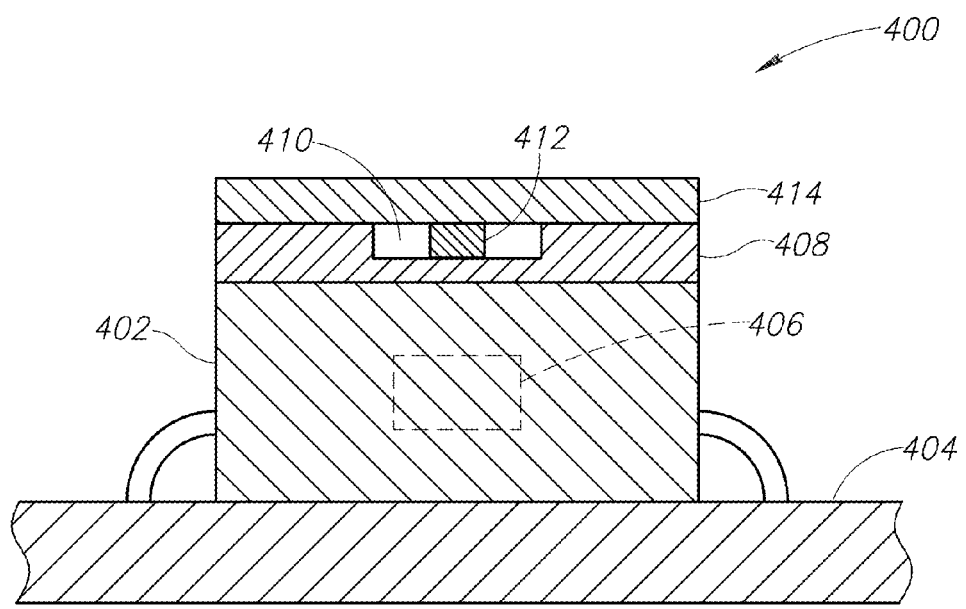
FIG. 4 is a cross-sectional view of an electrical component having another lid with a channel and further having a piezoelectric fan positioned to generate an air flow through the channel in accordance with another embodiment.

FIG. 4 shows a cross-sectional view of still another assembly 400 having a chip 402 mounted on a circuit board 404. A hot die 406 is located within the chip 402, which in turn is covered with a lid 408 having a channel 410. In the illustrated embodiment, the lid 408 has a C-shape with an open side of the "C" facing upward such that a piezoelectric fan 412 may be supported on a portion of the lid 408. Again, the channel 410 is preferably wide enough to permit a sufficient amount of air flow at a sufficient rate to convectively transfer heat generated by the hot die 406 within the chip 402. While the channel 410 is shown formed in the lid 408, it is understood that a channel or duct may be part of or formed in other mechanical parts within the chassis, and thus the location of the channel is not limited to just the electrical component and/or the lid. A heat spreader 414 may optionally be in thermally conductive contact with the lid 408.

It should be emphasized that the above-described embodiments are merely possible examples of implementations of the invention. Many variations and modifications may be made to the above-described embodiments. For example, the piezoelectric fan may be positioned to push or pull air through a duct instead of an open channel. All such modifications and variations are intended to be included herein within the scope of this disclosure and protected by the following claims.

The invention claimed is:

1. A system comprising:
    a chassis having at least one panel with opposing surfaces, and wherein one of the opposing surfaces is exposed to an ambient environment;
    a circuit board located within the chassis;
    an electrical component mounted on the circuit board, the electrical component having a channel formed therein, wherein components within the electrical component comprise:
        at least one hot die that generates heat during operation; and
        a piezoelectric fan arranged proximate the channel of the electrical component, and
    wherein during operation, the piezoelectric fan generates a thermally convective flow of air that is drawn into the channel from outside of the electrical component,
    wherein the convective flow of air is moved through the channel to the outside of the electrical component.

2. The system of claim 1, wherein the electric component is an integrated circuit chip.

3. The system of claim 1, wherein the at least one channel includes a top panel of the chassis.

4. The system of claim 1, wherein the channel is etched into the electric component.

5. The system of claim 1, wherein the channel is a duct extending through the electrical component.

6. The system of claim 1, wherein the piezoelectric fan is located within the channel.

7. The system of claim 1, wherein the piezoelectric fan is located adjacent to the channel.

8. The system of claim 1, wherein the piezoelectric fan is positioned to draw hot air generated by the electrical component in a desired direction.

9. The system of claim 8, wherein the desired direction is away from a second electrical component mounted on the circuit board.

10. The system of claim 8, wherein the piezoelectric fan is positioned to generate an air flow that moves beneath a heat shield.

11. A system comprising:
    a chassis having a top panel with an interior surface and an exterior surface, wherein the exterior surface is exposed to an ambient environment;
    a heat shield extending from the interior surface, the heat shield having an upper end portion coupled to the top panel and free end portion distal from the upper end portion;
    a circuit board located within the chassis;
    at least two electrical components mounted proximate each other on the circuit board, the electrical components spaced apart such that the free end portion of the heat shield is in the spaced apart region, one of the electrical components having a channel formed in the electrical component; and
    a piezoelectric fan arranged in the chassis to generate air flow along the channel.

12. The system of claim 11, wherein the free end portion of the heat shield is spaced apart from the circuit board.

13. The system of claim 11, wherein one of the electrical components includes an integrated circuit chip with a hot die.

14. A method for cooling an electrical component within a media device, wherein internal components of the electrical component include at least one hot die and a piezoelectric fan, and wherein the electrical component includes a channel that permits a convective air flow to be drawn into the channel from outside of the electrical component and moved through the channel to the outside of the electrical component, the method comprising:
    operating the hot die, wherein heat is generated during operation of the hot die; and
    activating the piezoelectric fan to generate the convective air flow through the channel of the electrical component, wherein a rate of the air flow convectively transfers a desired amount of heat from the hot die of the electrical component to another region within the media device when the air flow is moved by operation of the piezoelectric fan to the outside of the electrical component.

15. The method of claim 14, wherein activating the piezoelectric fan includes selectively turning on the fan when a sensed temperature in the media device exceeds a set-point temperature.

16. The method of claim 14, wherein directing the air flow through the channel includes directing the air flow along an open channel.

17. The method of claim 14, wherein directing the air flow through the channel includes directing the air flow through a duct.

18. The method of claim 14, wherein convectively transferring heat includes drawing cooler air past the electrical component by action of the piezoelectric fan.

19. The method of claim 14, further comprising:
    supporting the piezoelectric fan on a surface that defines one side of the channel.

20. The method of claim 14, wherein directing the air flow includes moving air beneath a free end of a heat shield proximate the electrical component.

* * * * *